United States Patent
Stengl et al.

(10) Patent No.: US 6,614,066 B2
(45) Date of Patent: Sep. 2, 2003

(54) FERROELECTRIC TRANSISTOR AND MEMORY CELL CONFIGURATION WITH THE FERROELECTRIC TRANSISTOR

(75) Inventors: Reinhard Stengl, Stadtbergen (DE);
Hans Reisinger, Grünwald (DE);
Thomas Haneder, Dachau (DE);
Harald Bachhofer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,418

(22) Filed: Apr. 1, 2002

(65) Prior Publication Data

US 2002/0117702 A1 Aug. 29, 2002

Related U.S. Application Data

(63) Continuation of application No. PCT/DE00/03468, filed on Sep. 29, 2000.

(30) Foreign Application Priority Data

Sep. 30, 1999 (DE) .......................... 199 47 117

(51) Int. Cl.$^7$ .............................. H01L 29/76
(52) U.S. Cl. ................ 257/295; 257/316; 257/319; 257/296
(58) Field of Search ................. 257/295, 316, 257/310, 315, 319, 298, 296, 324

(56) References Cited

U.S. PATENT DOCUMENTS 5,384,729 A * 1/1995 Sameshima ............... 365/145
5,708,284 A    1/1998 Onishi
6,107,656 A * 8/2000 Igarashi ..................... 257/295

FOREIGN PATENT DOCUMENTS

EP    0 566 585 B1   10/1993
JP    10 135 362      5/1998

OTHER PUBLICATIONS

Lee, H. N. et al.: "Fabrication of Metal–Ferroelectric–Insulator–Semiconductor Field Effect Transistor (MEFISFET) Using Pt–SrBi$_2$Ta$_2$O$_9$–Y$_2$O$_3$–Si Structure", XP–000728158, International Conference on Solid State Devices and Materials, 1997, pp. 382–383.

Han, J.–P. et al: "Memory Effects of SrBi$_2$Ta$_2$O$_9$ Capacitor on Silicon with a Silicon Nitride Buffer", Integrated Ferroelectrics, vol. 22, 1994, pp. 213–221.

* cited by examiner

*Primary Examiner*—Carl Whitehead, Jr.
*Assistant Examiner*—Yennhu B Huynh
(74) *Attorney, Agent, or Firm*—Laurence A. Greenberg; Werner H. Stemer; Ralph E. Locher

(57) ABSTRACT

A first source-drain region, a channel region, and a second source-drain region are arranged one after another in a semiconductor substrate. At least the surface of the channel region and parts of the first source-drain region are covered by a dielectric layer. A ferroelectric layer is disposed on the surface of the dielectric layer between two polarization electrodes. A gate electrode is arranged on the surface of the dielectric layer. The thickness of the dielectric layer is dimensioned such that a remanent polarization of the ferroelectric layer, which is aligned between the two polarization electrodes, produces compensation charges in part of the channel region. The ferroelectric transistor is suitable as a memory cell for a memory cell configuration.

8 Claims, 2 Drawing Sheets

FERROELECTRIC TRANSISTOR AND MEMORY CELL CONFIGURATION WITH THE FERROELECTRIC TRANSISTOR

CROSS-REFERENCE TO RELATED APPLICATION

This application is a continuation of copending International Application No. PCT/DE00/03468, filed Sep. 29, 2000, which designated the United States.

BACKGROUND OF THE INVENTION

Field of the Invention

The invention lies in the fields of integrated technology, semiconductor technology, and memory technology.

Ferroelectric materials have been investigated for some time with respect to their suitability for storage applications, that is for memory applications. Here, two variants are primarily being considered. Firstly, ferroelectric material can be used as a dielectric layer with a high dielectric constant in a capacitor of a DRAM memory cell configuration. Secondly, ferroelectric transistors have been proposed (see, for example, European patent EP 0 566 585 B1; H. N. Lee et al, Ext. Abstr. Int. Conf. SSDM, Hamatsu, 1997, pp. 382–83; I. P. Han et al, Integrated Ferroelectrics, 1998, Vol. 22, pp. 213–21), which have two source-drain regions, a channel region and a gate electrode, a layer of ferroelectric material being provided between the gate electrode and the channel region. The conductivity of these transistors depends on the state of polarization of the layer of ferroelectric material. Ferroelectric transistors of this type are suitable for use in nonvolatile memories. In this case, two different logic values of an item of digital information are associated with two different states of polarization of the layer of ferroelectric material. Further possible uses for such ferroelectric transistors are, for example, neural networks.

Since ferroelectric material which is arranged on the surface of a semiconductor substrate exhibits poor boundary surface properties, which exert a negative influence on the electrical properties of a ferroelectric transistor, it has been proposed to use an intermediate layer of $SiO_3$ (See EP 0 566 585 B1), MgO, $CeO_2$, $ZrO_2$, $SrTiO_3$, $Y^2O_3$(See H. N. Lee et al, Ext. Abstr. Int. Conf. SSDM, Hamatsu, 1997, pp. 382–383) or $Si_3N_4$(see, for example I. P. Han et al, Integrated Ferroelectrics, 1998, Vol. 22, pp 213–221) between the ferroelectric layer and the semiconductor substrate in a ferroelectric transistor. These materials are insulating, stable oxides, which produce a sufficiently good boundary surface between the ferroelectric layer and the surface of the semiconductor substrate.

Between the gate electrode and the semiconductor substrate acting as an electrode, the ferroelectric layer is polarized. As a result of the remanent polarization, an electric field is generated. If a value of about $10\ \mu c/cm^2$ is assumed for the remanent polarization of the ferroelectric layer, then, for an intermediate layer of $SiO_2$ with $\in_r=3.9$, a value of about 29 MV/cm is calculated for the electric field strength. The electric field strength is calculated in accordance with the formula $E=\sigma/(\in_0 \cdot \in_r)$, where E is the electric field strength and $\sigma$ is the remanent polarization. Since the breakdown field strength of $SiO_2$ is only around 10 MV/cm, electric breakdown of the intermediate layer must therefore be expected. The values for the remanent polarization, in particular of SBT ($SrBi_2Ta_2O_9$) or PZT ($PbZr_xPi_{1-x}O_2$), lie above $10\ \mu C/cm^2$, and even when using a dielectric material with a higher dielectric content than $SiO_2$, it is therefore necessary to expect that field strengths in a critical range will occur.

SUMMARY OF THE INVENTION

It is accordingly an object of the invention to provide a ferroelectric transistor and its utilization in a memory cell configuration, which overcomes the above-mentioned disadvantages of the heretofore-known devices and methods of this general type and which provides for a ferroelectric transistor wherein breakdown of a dielectric layer between a ferroelectric layer and a semiconductor substrate is avoided.

With the foregoing and other objects in view there is provided, in accordance with the invention, a ferroelectric transistor, comprising:

a substrate having a main surface;

a first source-drain region, a channel region, and a second source-drain region adjoining said main surface of said semiconductor substrate, with said channel region arranged between said first and second source-drain regions;

a dielectric layer covering at least said channel region and overlapping said first source-drain region;

a ferroelectric layer disposed on said dielectric layer and covering at least a part of said first source-drain region adjacent said channel region;

a first polarization electrode and a second polarization electrode disposed on said dielectric layer, with said ferroelectric layer arranged between said first and second polarization electrodes;

a gate electrode above a first area of said channel region;

said dielectric layer having a thickness above said first area less than a thickness above a second area of said channel region below said second polarization electrode; and said dielectric layer having a thickness above said part of said first source-drain region adjoining said channel region dimensioned such that a remanent polarization of said ferroelectric layer, aligned parallel to said main surface of said substrate, produces compensation charges in said second area of said channel region.

The ferroelectric transistor is particularly suitable for use as a memory cell in a memory cell configuration.

The ferroelectric transistor comprises a first source-drain region, a channel region and a second source-drain region, which adjoin a main surface of a semiconductor substrate. Here, the channel region is arranged between the first source-drain region and the second source-drain region. A dielectric layer is provided, which covers at least the surface of the channel region and overlaps the surface of the first source-drain region. Arranged on the surface of the dielectric layer is a ferroelectric layer, which covers at least a part, adjacent to the channel region, of the first source-drain region.

Also arranged on the surface of the dielectric layer are a first polarization electrode and a second polarization electrode, between which the ferroelectric layer is arranged. A gate electrode is arranged on the surface of the dielectric layer, above an area of the first channel region.

The thickness of the dielectric layer above the first area, that is to say under the gate electrode, is lower than above a second area of the channel region, which is arranged under the second polarization electrode. The thickness of the dielectric layer above that part of the first source-drain region which adjoins the channel region and is covered by the ferroelectric layer is dimensioned such that a remanent polarization of the ferroelectric layer, which is aligned parallel to the main surface, produces compensation charges in the second area of the channel region.

Since a remanent polarization of the ferroelectric layer is aligned parallel to the main surface in the ferroelectric transistor, because of the first polarization electrode and the second polarization electrode, the electric field generated by the remanent polarization is likewise aligned parallel to the main surface. The compensation charges in the second area of the channel region are generated by the lateral stray field from the electric field, which is much lower than the electric field itself. Therefore, breakdown of the dielectric layer between the semiconductor substrate and the ferroelectric layer is reliably avoided.

Depending on the state of polarization of the ferroelectric layer, a different number of compensation charges is generated in the second area of the channel region. In order to store an item of digital information, the ferroelectric layer is switched into two different polarization states, one polarization state generating so many compensation charges in the second area that the second area conducts, while the other polarization state generates so few compensation charges that the second area of the channel region does not conduct. The ferroelectric transistor is controlled via the gate electrode, which controls the first area of the channel region. A check is made to see whether the ferroelectric transistor conducts, in this case the polarization of the ferroelectric layer is adequate for conductivity of the second area of the channel region, or whether the ferroelectric transistor does not conduct, in this case the state of polarization is inadequate for conductivity of the second area of the channel region.

The change in the state of polarization of the ferroelectric layer, which corresponds to writing or changing stored information, is carried out via the first polarization electrode and the second polarization electrode. In particular, the thickness of the dielectric layer above that part of the first source-drain region which adjoins the channel region is less than the thickness of the dielectric layer above the second area of the channel region and less than the dimension of the second area of the channel region parallel to the main surface. This ensures that the insulation of the dielectric layer above the second area is sufficiently good for compensation charges to accumulate in the second area of the channel and not on the surface of the dielectric layer.

In accordance with an added feature of the invention, the ferroelectric layer is arranged partly above the channel region. In this case, the thickness of the dielectric layer above a part of the channel region which adjoins the first source-drain region and above that part of the first source-drain region which adjoins the channel region is substantially the same. This configuration of the invention has the advantage that sufficient compensation charges are generated in the channel region, even in the case of a low lateral stray field.

With regard to a reduced space requirement of the ferroelectric transistor, it is advantageous to form the second polarization electrode and the gate electrode as a common electrode.

In accordance with an additional feature of the invention, the thickness of the dielectric layer underneath the first polarization electrode, which is arranged above the first source-drain region, and above that part of the first source-drain region which adjoins the channel region is substantially the same. In this configuration, the dimension perpendicular to the main surface of the boundary surface between the first polarization electrode and the ferroelectric layer is greater than between the second polarization electrode and the ferroelectric layer. As a result, the electric stray field that acts in the second area of the channel region is increased.

In accordance with another feature of the invention, the thickness of the dielectric layer underneath the first polarization electrode and underneath the second polarization electrode is substantially the same. As a result, the dimension perpendicular to the main surface of the boundary surface between the first polarization electrode and the ferroelectric layer and the second polarization electrode and the ferroelectric layer is substantially the same, which is advantageous with respect to the production of the ferroelectric transistor.

In accordance with a concomitant feature of the invention, the dielectric layer comprises a first dielectric layer and a second dielectric layer. The first dielectric layer is in this case arranged on the main surface. The second dielectric layer is arranged above it. The second dielectric layer has an opening in the area of the gate electrode, so that the gate electrode is arranged on the surface of the first dielectric layer. The first dielectric layer thus corresponds to the gate dielectric of the ferroelectric transistor. This configuration has the advantage that the first dielectric layer can be optimized with respect to its characteristics as a gate dielectric, while the second dielectric layer represents the boundary surface to the ferroelectric layer and can be optimized with respect to the latter. The first dielectric layer preferably contains $SiO_2$, $CeO_2$, $ZrO_2$ or $Ta_2O_5$ and has a thickness between 3.5 nm and 20 nm. The second dielectric layer preferably contains $Si_3N_4$, $CeO_2$ or another selectively etchable dielectric material and, above the second area of the channel region has a thickness between 10 nm and 500 nm and, above that part of the first source-drain region which adjoins the channel region, has a thickness between 10 nm and 300 nm. The second dielectric layer can also contain nonselectively etchable dielectric material, if the selective etchability is of lower importance for production. With regard to possible degradation of the ferroelectric layer, it is advantageous to form the second dielectric layer as an air gap or vacuum area. For this purpose, an auxiliary structure is produced, which is etched out again after the adjacent structures have been finished.

The ferroelectric layer can contain all ferroelectric materials which are suitable for a ferroelectric transistor. In particular, the ferroelectric layer contains SBT ($SrBi_2Ta_2O_9$), PZT ($PbZr_xTi_{1-x}O_2$) or BMF ($BaMgF_4$).

All substrates which are considered for the production of integrated circuits are suitable as a semiconductor substrate. In particular, the semiconductor substrate can be a monocrystalline silicon wafer, an SOI substrate, an SiGe substrate or a III–V semiconductor.

Other features which are considered as characteristic for the invention are set forth in the appended claims.

Although the invention is illustrated and described herein as embodied in a ferroelectric transistor and its use in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
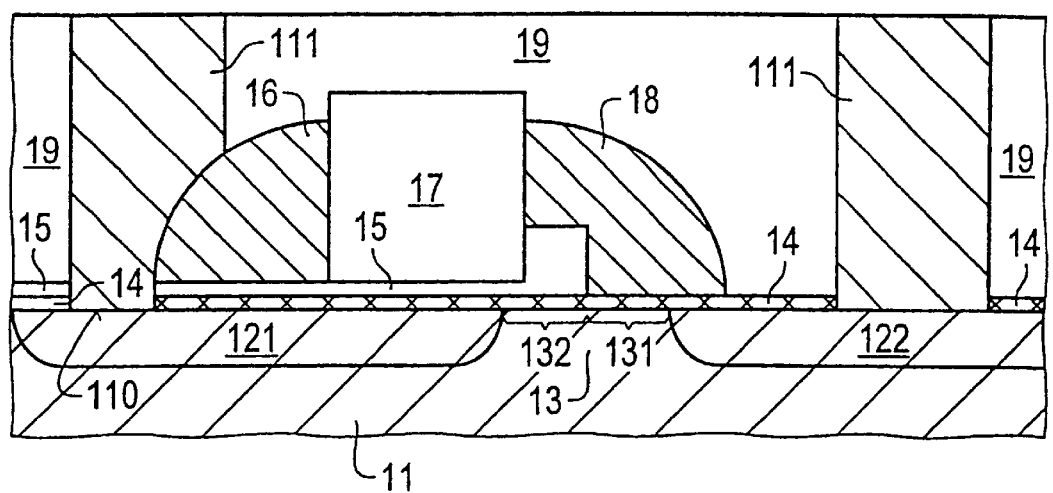
FIG. 1 is a section taken through a ferroelectric transistor according to the invention.

Referring now to the figures of the drawing in detail and first, particularly, to FIG. 1 thereof, there is shown a semiconductor substrate 11 made of monocrystalline silicon. A first source-drain region 121 and a second source-drain region 122 are arranged in the substrate 11. The first and second source-drain regions 121, 122 are n$^+$-doped and a channel region 13 is arranged between them. The first source-drain region 121, the channel region 13 and the second source-drain region 122 adjoin a main surface 110 of the semiconductor substrate 11.

A first dielectric layer 14 of $CeO_2$, $ZrO_2$, $Ta_2O_5$ or $SiO_2$ in a layer thickness of 20 nm is arranged on the main surface 110. Arranged above the first source-drain region 121 is a second dielectric layer 15 of $Si_3N_4$, which covers a part of the channel region 13 that adjoins the first source-drain region 121. Arranged on the surface of the second dielectric layer are a first electrode 16, a ferroelectric layer 17 and a second electrode 18. The second electrode 18 overlaps the second dielectric layer 15 laterally and is arranged partly on the surface of the first dielectric layer 14. The ferroelectric layer 17 is arranged above a part of the first source-drain region 121 which adjoins the channel region 13. The ferroelectric layer 17 also extends until it is above a part of the channel region 13 which adjoins the first source-drain region 121. The ferroelectric layer contains PZT or SBT and has a thickness of 100 to 300 nm. The first electrode 16 and the second electrode 18 contain platinum.

The thickness of the second dielectric layer 15 underneath the first electrode 16 and underneath the ferroelectric layer 17 is 200 nm. The thickness of the dielectric layer 15 in the area of the second electrode 18 is 2 to 50 nm. That part of the second electrode 18 which is arranged on the surface of the first dielectric layer 14 above a first area 131 of the channel region 13 acts as a gate electrode. That part of the second electrode 18 which is arranged on the surface of the second dielectric layer 15 above a second region 132 acts as the second polarization electrode. The first electrode 16 acts as the first polarization electrode.

A planarizing passivation layer 19 is provided, which covers the first electrode 16, the ferroelectric layer 17 and the second electrode 18, and wherein metallic contacts 111 are provided, which reach as far as the first source-drain region 121, the first electrode 16 and the second source-drain region 122. In this case, the first electrode 16 and the first source-drain region 121 are provided with a common contact 111.

In this ferroelectric transistor, by applying a voltage between the first electrode 16 and the second electrode 18, the remanent polarization of the ferroelectric layer 17 is aligned parallel to the direction of a current through the channel region 13. The ferroelectric layer 17 only partly covers the channel region 13. The second electrode 18 only partly covers the ferroelectric layer 17. In this arrangement, surface charges needed to compensate for the ferroelectric polarization of the ferroelectric layer 17 are primarily arranged at the boundary surface to the first electrode 16 and to the second electrode 18. In the area wherein the ferroelectric layer 17 laterally adjoins the thicker part of the second dielectric layer 15 above the second area 132, the surface charges for the compensation of the ferroelectric compensation are arranged in the semiconductor substrate 11. These compensation charges are arranged in that part of the channel region 13 which adjoins the first source-drain region 121. Depending on the polarization of the ferroelectric layer 17, they have the effect that this part of the channel region 13 is conductive or not. In order to effect conductivity of this part of the channel region 13, a charge density of about 0.1 $\mu C/cm^2$ is adequate. This corresponds approximately to one percent of the value of the remanent polarization of the ferroelectric layer 17. In approximate terms, this part of the channel region 13 can therefore be 10 to 100 times larger than that part of the ferroelectric layer 17 which laterally adjoins the second dielectric layer 15.

Since, in this ferroelectric transistor, the greatest part of the compensation charges are localized at the boundary surfaces of the ferroelectric layer 17 to the first electrode 16 and second electrode 18, the quiescent state and therefore the holding of data over time are similarly stable to that in a ferroelectric capacitor. No depolarization fields occur, which are always produced when there is a significant distance between the surface of the ferroelectric layer and the compensation charges.

Arranging the ferroelectric layer over only part of the channel region 13 means that the electric field strength in the vicinity of the ferroelectric layer 17 and the electric field strength on the first dielectric layer 14 are different in the first area 131, wherein said layer acts as a gate dielectric. It is therefore possible for electric breakdowns and reliability problems at the gate dielectric to be prevented. At the same time, the ferroelectric layer 17 can be polarized up to its maximum value, which leads to an improvement in the holding of data. Therefore, all ferroelectric materials which are suitable for use in microelectronic components, PZT, SBT or related materials, which are produced by doping with other substances or by replacing one element by another, are therefore considered for the ferroelectric layer 17.

The high remanent polarization of ferroelectric substances which are optimized from various points of view, such as fatigue, imprint, etc., and the associated high charge densities do not lead to any kind of problems with the transistor structure in these ferroelectric transistors.

That part of the second electrode 18 which is arranged above the first area 131 acts as a gate electrode in the transistor. It is arranged immediately on the surface of the first dielectric layer 14, which acts as a gate dielectric in this area. As compared with known ferroelectric transistors, this has the advantage that no further capacitances are connected in series between the gate electrode and the gate dielectric. In addition, between the ferroelectric layer 17 and the first electrode 16, which acts as the first polarization electrode, and the second electrode 18, which acts as the second polarization electrode, no further capacitances are connected either, via which there would be a drop in the voltage which is applied between the first electrode 16 and the second electrode 18 for the purpose of polarization. As compared with known ferroelectric transistor structures, the ferroelectric layer 17 in this ferroelectric transistor can be polarized without problems. Lower programming voltages are required than those in known arrangements. The ferroelectric transistor can be implemented with only three terminals.

In order to write or erase information, a corresponding write or erase voltage is applied to the first electrode 16 and to the second electrode 18. As a result, the ferroelectric layer 17 is polarized.

To read information out, the same voltage is applied to the first electrode 16 and to the second electrode 18. As a result, there is no voltage drop across the ferroelectric layer 17. This permits nondestructive reading.

In applications wherein different voltages are to be applied to the first electrode 16 and the second electrode 18 in order to read out the information, it is advantageous to apply a programming pulse between the first electrode 16 and the second electrode 18 after the reading operation, in order to refresh the stored information again by polarizing the ferroelectric layer 17.

The read voltage on the second source-drain region 122 is chosen such that it causes the first area 131 of the channel region 13, which is not controlled by the ferroelectric layer 17, to be brought into inversion and therefore opened. The assessment of the written information is carried out by means of a continuity test between the first source-drain region 121 and the second source-drain region 122, it being possible for current to flow only when the ferroelectric layer 17 is polarized in such a way that the channel region 13 outside the first area 131 is likewise inverted.

Figure 2:
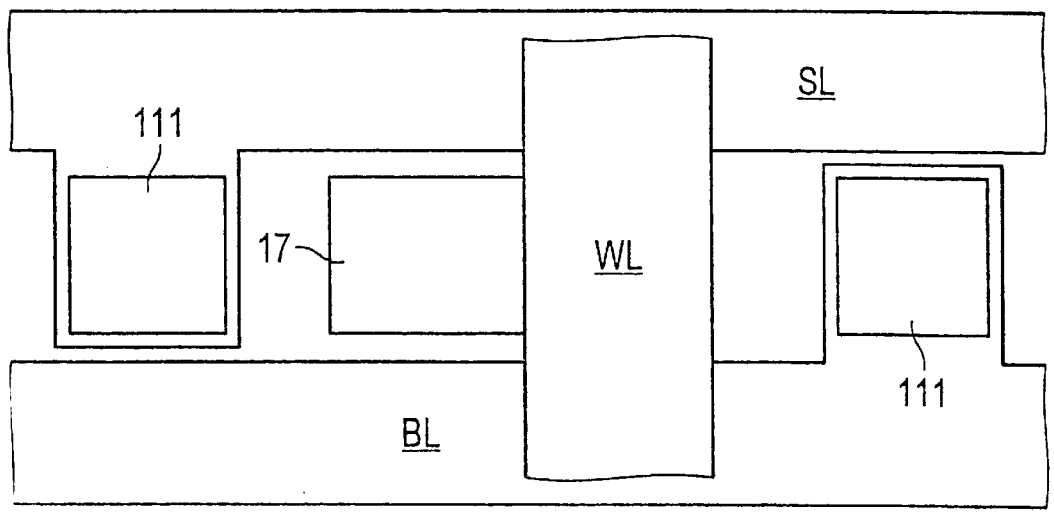
FIG. 2 is a diagrammatic layout for a memory cell configuration which has ferroelectric transistors as memory cells.

In order to control a ferroelectric transistor used as a memory cell, as outlined by using FIG. 1, in a memory cell configuration, the first source-drain region 121 and the first electrode 16 are connected via the contact 111 to a write line SL (see FIG. 2). The second source-drain region 122 is connected via the associated contact 111 to a bit line BL. The write line SL runs substantially parallel to the bit line BL. At right angles to the write line SL and to the bit line BL there runs a word line WL, which is connected to the second electrode 18, which in turn adjoins the ferroelectric layer 17. In a memory cell configuration, a large number of mutually parallel bit lines, write lines and word lines are provided, and are connected in the manner described to individual ferroelectric transistors.

Figure 3:
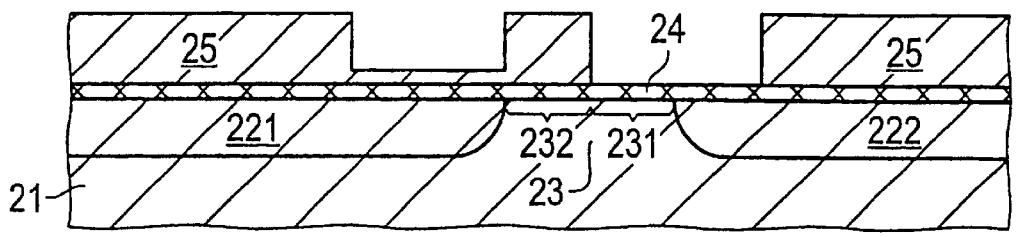
FIG. 3 to FIG. 5 are sectional views illustrating steps in the production of a ferroelectric transistor according to the invention.
Figure 4:
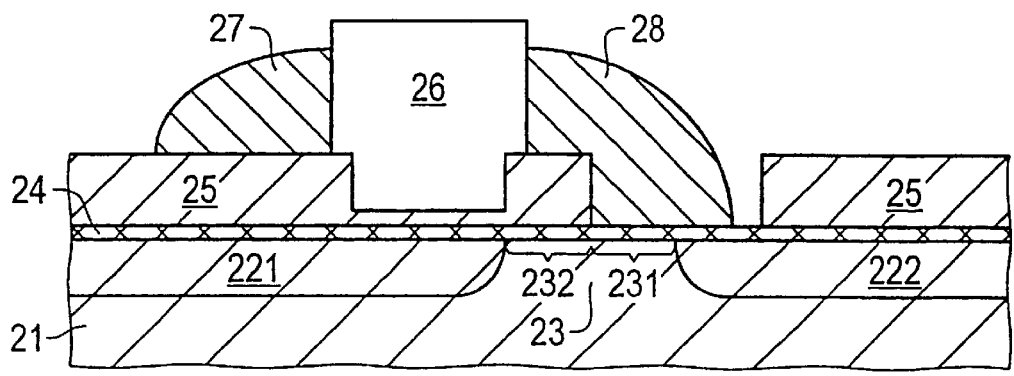
Figure 5:
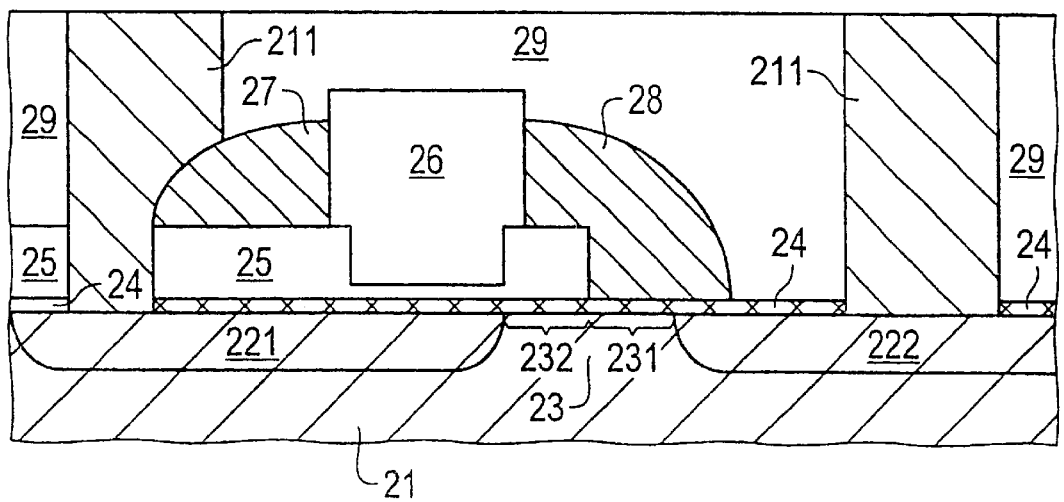

Reference will now be had to FIGS. 3 to 5. In the fabrication of a ferroelectric transistor, first of all active regions are defined (not illustrated) in a semiconductor substrate 21 of monocrystalline silicon by producing an insulation structure in accordance with a LOCOS process or an STI process. Then, by means of masked implantation, a first source-drain region 221 and a second source-drain region 222 are produced (see FIG. 3). A channel region 23 is arranged between the first source-drain region 221 and the second region 222.

A first dielectric layer 24 is applied to the surface of the first source-drain region 221, the second source-drain region 222 and the channel region 23. The first dielectric layer 24 can be produced from $SiO_2$ by means of oxidation in a thickness of 4 to 10 nm or else produced by means of CVD deposition from $CeO_2$ in a thickness of 5 to 20 nm and subsequent tempering. Then, a second dielectric layer 25 of $Si_3N_4$, strontium titanate or the same material as the first dielectric layer 24, is deposited and structured. Structuring is carried out by means of masked etching. In the process, the surface of the first dielectric layer 24 is exposed above a first area 231 of the channel region 23. Furthermore, above a part of the first source-drain region 221 which adjoins the channel region 23, the thickness of the second dielectric layer 25 is reduced to 200 nm. Above a second area 232 of the channel region 23, the full thickness of 10 to 500 nm of the second dielectric layer 25 is maintained.

A ferroelectric layer 26 of PZT or SBT is then formed by means of deposition in a CVD process in a thickness of 100 to 300 nm and subsequent structuring. The ferroelectric layer 26 is arranged on the surface of the second dielectric layer 25, above the part of the first source-drain region 221 which adjoins the channel region 23 (see FIG. 4). By means of the deposition of platinum and anisotropic etching, a first electrode 27 and a second electrode 28, which are similar to spacers, are formed on opposite sides of the ferroelectric layer 26 (see FIG. 4). The second electrode 28 extends as far as the exposed surface of the first dielectric layer 24 above the second area 231 of the channel region 23 and the adjacent second source-drain region 222.

In order to improve the quality of the ferroelectric layer 26, tempering is carried out, which can take place both directly after the deposition of the ferroelectric layer, after the structuring of the ferroelectric layer, or after the deposition of platinum. Alternatively, a plurality of tempering operations can be carried out at different times.

After that, a planarizing passivation layer 29 is produced by depositing a further dielectric layer of 400 to 500 nm and planarizing by means of CMP (chemical mechanical polishing) (see FIG. 5). In the planarizing passivation layer 29, contact holes to the first source-drain region 221 and to the second source-drain region 222 are etched and provided with contacts 211. The contact hole to the first source-drain region 221 at the same time reaches as far as the first electrode 27, so that the corresponding contact 211 connects the first electrode 27 electrically to the first source-drain region 221.

The ferroelectric transistor illustrated in FIG. 5 differs from the ferroelectric transistor illustrated in FIG. 1 only by the fact that in FIG. 5 the thickness of the second dielectric layer 25 is reduced only above that part of the first source-drain region 221 which adjoins the channel region 23, and that the boundary surfaces between the first electrode 27 and the ferroelectric layer 26 and between the second electrode 28 and the ferroelectric layer 26 are substantially of equal size. With respect to the functioning and the advantages explained in connection with FIG. 1, the ferroelectric transistors do not differ.

We claim:

1. A ferroelectric transistor, comprising:

a substrate having a main surface;

a first source-drain region, a channel region, and a second source-drain region adjoining said main surface of said semiconductor substrate, with said channel region arranged between said first and second source-drain regions, said channel region having a first area adjacent said second source-drain-region and a second area adjacent said first source-drain-region;

a dielectric layer covering at least said channel region and overlapping said first source-drain region, said dielectric layer having a first thickness above said first area of said channel region, having a second thickness above said second area of said channel region, and having a third thickness above said first source-drain-region, said first thickness being less than said third thickness and said third thickness being less than said second thickness;

a ferroelectric layer disposed on said dielectric layer and covering at least a part of said first source-drain region adjacent said channel region;

a first polarization electrode;

a second polarization electrode and a gate electrode adjoining one another and forming a common electrode, said second polarization electrode disposed above said second area and said gate electrode disposed above said first area of said channel region;

said first polarization electrode and said common electrode disposed on said dielectric layer, with said ferroelectric layer arranged between said first and second polarization electrodes; and said third thickness of said dielectric layer being dimensioned such that a remanent polarization of said ferroelectric layer, aligned parallel to said main surface of said substrate, produces compensation charges in said second area of said channel region.

2. The ferroelectric transistor according to claim 1, wherein said third thickness of said dielectric layer less than a dimension of said second area of said channel region parallel to said main surface.

3. The ferroelectric transistor according to claim 1, wherein said ferroelectric layer is disposed partly above said channel region, and the thickness of said dielectric layer above a part of said channel region adjoining said first source-drain region and the thickness above the part of said first source-drain region adjoining said channel region are substantially identical.

4. The ferroelectric transistor according to claim 1, wherein the thickness of said dielectric layer underneath said first polarization electrode and the thickness of said dielectric layer above the part of said first source-drain region adjoining the channel region are substantially identical.

5. The ferroelectric transistor according to claim 1, wherein the thickness of said dielectric layer underneath said first polarization electrode and the thickness of said dielectric layer underneath said second polarization electrode are substantially identical.

6. The ferroelectric transistor according to claim 1, wherein said dielectric layer includes a first dielectric layer disposed on said main surface and a second dielectric layer having an opening formed therein in the area of said gate electrode, whereby said gate electrode is arranged on a surface of said first dielectric layer.

7. The ferroelectric transistor according to claim 6,
wherein said first dielectric layer contains an oxide selected from the group consisting of $SiO_2$, $CeO_2$, $ZrO_2$ and $Ta_2O_5$ and has a thickness between 3.5 and 20 nm; and wherein said second dielectric layer contains a material selected from the group consisting of $Si_3N_4$ and $CeO_2$, said second dielectric layer has a thickness between 10 and 500 nm above the second area of said channel region, and a thickness between 10 and 300 nm above the part of said first source-drain region adjoining said channel region.

8. The ferroelectric transistor according to claim 1, wherein said ferroelectric layer contains a material selected from the group consisting of SBT ($SrBi_2Ta_2O_9$), PZT ($PbZr_xTi_{1-x}O_2$), and BMF ($BaMgF_4$).

* * * * *